(12) United States Patent
Oh

(10) Patent No.: US 12,507,349 B2
(45) Date of Patent: Dec. 23, 2025

(54) CIRCUIT BOARD AND MANUFACTURING METHOD THEREOF

(71) Applicant: SAMSUNG ELECTRO-MECHANICS CO., LTD., Suwon-si (KR)

(72) Inventor: Youngkyun Oh, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 133 days.

(21) Appl. No.: 18/207,331

(22) Filed: Jun. 8, 2023

(65) Prior Publication Data
US 2024/0206078 A1 Jun. 20, 2024

(30) Foreign Application Priority Data
Dec. 16, 2022 (KR) .................. 10-2022-0177095

(51) Int. Cl.
*H05K 1/11* (2006.01)
*H05K 3/24* (2006.01)

(52) U.S. Cl.
CPC ............. *H05K 3/243* (2013.01); *H05K 1/111* (2013.01); *H05K 1/115* (2013.01)

(58) Field of Classification Search
CPC ...... H05K 3/243; H05K 1/111; H05K 3/3452; H05K 2203/107; H05K 3/242; H05K 1/02; H05K 3/22; H05K 3/282; H05K 3/288; H05K 2201/1084; H05K 3/027; H05K 3/06

See application file for complete search history.

(56) References Cited

U.S. PATENT DOCUMENTS

| | | | | |
|---|---|---|---|---|
| 4,289,575 A | * | 9/1981 | Matsumoto ............ | H05K 3/243 216/13 |
| 2003/0159282 A1 | * | 8/2003 | Yuzawa ................. | H05K 3/242 29/852 |
| 2004/0132230 A1 | | 7/2004 | Kim | |
| 2009/0260853 A1 | * | 10/2009 | Nagaya ................. | H05K 3/242 174/250 |

FOREIGN PATENT DOCUMENTS

| | | |
|---|---|---|
| JP | 2017-191845 A | 10/2017 |
| KR | 10-0463442 B1 | 12/2004 |
| KR | 10-1167791 B1 | 7/2012 |

\* cited by examiner

*Primary Examiner* — Ishwarbhai B Patel
(74) *Attorney, Agent, or Firm* — Morgan Lewis & Bockius LLP

(57) ABSTRACT

A circuit board according to an embodiment includes: an insulating layer; a conductive pad disposed on the insulating layer, a plating lead-in wire that is disposed on the insulating layer and is connected to the conductive pad; and a solder resist layer that is disposed on the insulating layer and includes a first opening overlapping the conductive pad and a second opening spaced apart from the first opening. The plating lead-in wire extends from the conductive pad to one side wall of the second opening, and a second portion of the insulating layer overlapping the second opening is thinner than a first portion of the insulating layer overlapping the first opening.

11 Claims, 12 Drawing Sheets

CIRCUIT BOARD AND MANUFACTURING METHOD THEREOF

CROSS-REFERENCE TO RELATED APPLICATION

The present application claims the benefit of priority to Korean Patent Application No. 10-2022-0177095 filed on Dec. 16, 2022 in the Korean Intellectual Property Office, the entire contents of which are incorporated herein by reference.

BACKGROUND

1. Field

The present disclosure relates to a circuit board and a manufacturing method thereof.

2. Description of the Related Art

In a case of manufacturing a circuit board, an etch-back process is performed in which arbitrary plating connection wiring is connected to a conductive pad, plating is performed on a surface of the conductive pad, and the plating connection wiring is separated before an electrical test.

In the etch-back process, a dry film masking process or an LPR ink masking process is used, but the dry film masking process or the LPR ink masking process has a complicated manufacturing process and has restrictions on pattern design of the circuit board.

In addition, in the dry film masking process or the LPR ink masking process, a process issue is highly likely to occur due to a residue of the dry film or the LPR ink.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a circuit board and a manufacturing method thereof in which a manufacturing process is simple and occurrence of a process issue may be minimized.

However, problems to be solved by the embodiments are not limited to the above-described problem and may be variously extended in a range of technical ideas included in the embodiments.

A circuit board according to an embodiment includes: an insulating layer; a conductive pad disposed on the insulating layer; a plating lead-in wire that is disposed on the insulating layer and is connected to the conductive pad; and a solder resist layer that is disposed on the insulating layer and includes a first opening overlapping the conductive pad and a second opening spaced apart from the first opening. The plating lead-in wire extends from the conductive pad to one side wall of the second opening, and a first portion of the insulating layer overlapping the first opening is thicker than a second portion of the insulating layer overlapping the second opening.

The plating lead-in wire may not overlap the second opening on a plane.

The insulating layer may include a first surface and a second surface facing each other, and a height of the first surface of the second portion of the insulating layer based on the second surface of the insulating layer may be lower than a height of the first surface of the first portion of the insulating layer based on the second surface of the insulating layer.

A surface roughness of the second portion of the insulating layer may be greater than a surface roughness of the first portion of the insulating layer.

One end of the plating lead-in wire may be disposed at the same line as the one side wall of the second opening on a plane.

The circuit board may further include an auxiliary pad covering the conductive pad. The auxiliary pad may overlap the first opening.

The auxiliary pad may include a plating layer.

A manufacturing method of a circuit board according to an embodiment includes: forming a plating connection wiring and a conductive pad connected to the plating connection wiring on an insulating layer; forming a solder resist layer having a first opening overlapping the conductive pad on the insulating layer; forming a second opening by removing a portion of the solder resist layer overlapping the plating connection wiring using a laser processing process; and forming a plating lead-in wire by removing a portion of the plating connection wiring overlapping the second opening using the laser processing process.

A first portion of the insulating layer overlapping the first opening may be formed thicker than a second portion of the insulating layer overlapping the second opening.

The forming of the plating lead-in wire may include removing a portion of the plating connection wiring that is not directly connected to the conductive pad.

Each of the plating connection wiring and the conductive pad may be formed by a photolithography process.

A surface roughness of a second portion of the insulating layer may be formed to be greater than a surface roughness of a first portion of the insulating layer.

One end of the plating lead-in wire may be disposed at the same line as one side wall of the second opening on a plane.

A portion of the plating connection wiring may be removed using the laser processing process after the second opening is formed.

The second opening and a portion of the plating connection wiring may be simultaneously removed using the laser processing process.

The manufacturing method may further include forming an auxiliary pad covering the conductive pad. The auxiliary pad may be formed using a plating process applying an electrical signal to the plating connection wiring and the conductive pad.

A circuit board according to another embodiment includes: an insulating layer; a conductive pad disposed on the insulating layer; a plating lead-in wire that is disposed on the insulating layer and is connected to the conductive pad; and a solder resist layer that is disposed on the insulating layer and includes a first opening overlapping the conductive pad and a second opening spaced apart from the first opening. The plating lead-in wire extends from the conductive pad to one side wall of the second opening, and the insulating layer has a step portion at the one side wall of the second opening.

A thickness of a first portion of the insulating layer overlapping the first opening may be greater than a thickness of a second portion of the insulating layer overlapping the second opening.

A vertical wall of the step portion, one end of the plating lead-in wire, and one end of the solder resist layer covering the plating lead-in wire may be coplanar with the one side wall of the second opening.

The plating lead-in wire may include one end connected to the one side wall of the second opening and the other end connected to one side wall of the first opening facing the one side wall of the second opening.

The conductive pad may include a reduced-width portion having a width reduced from an adjacent portion of the conductive pad, and the reduced-width portion may be disposed in the first opening and include one end connected to the other end of the plating lead-in wire at the one side wall of the first opening.

According to the embodiments, since plating connection wiring may be cut to be electrically separated using a laser processing process, a separate dry film or LPR ink is not required to separate the plating connection wiring in an etch-back process so that a manufacturing process is simplified. Accordingly, manufacturing cost of a circuit board may be reduced.

In addition, since the separate dry film or LPR ink is not used, generation of a residue may be prevented so that a process issue such as the plating connection wiring not being separated and the like is minimized.

It is obvious that an effect of the embodiments is not limited to the above-described effect, and may be variously extended without departing from the spirit and scope of the present disclosure.

DETAILED DESCRIPTION OF THE EMBODIMENTS

Figure 1:
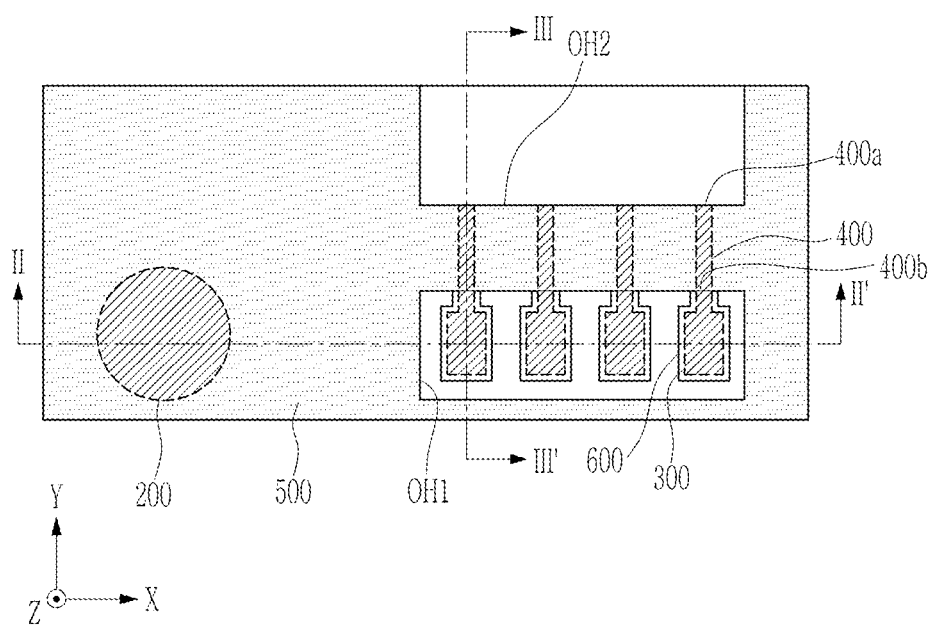
FIG. 1 is a plane view of a circuit board according to an embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, the accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Further, in the drawings, the size and thickness of each element are arbitrarily illustrated for ease of description, and the present disclosure is not necessarily limited to those illustrated in the drawings. In the drawings, for ease of description, the thicknesses of some layers and areas are exaggerated. In the drawings, for ease of description, the thicknesses of some layers and areas are exaggerated.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Furthermore, throughout the specification, "connected" does not only mean when two or more elements are directly connected, but also when two or more elements are indirectly connected through other elements, and when they are physically connected or electrically connected, and further, it may be referred to by different names depending on a position or function, and may also be referred to as a case in which respective parts that are substantially integrated are linked to each other.

Hereinafter, various embodiments and variations will be described in detail with reference to the drawings.

A circuit board according to an embodiment will be described with reference to FIGS. 1 to 3.

Figure 2:
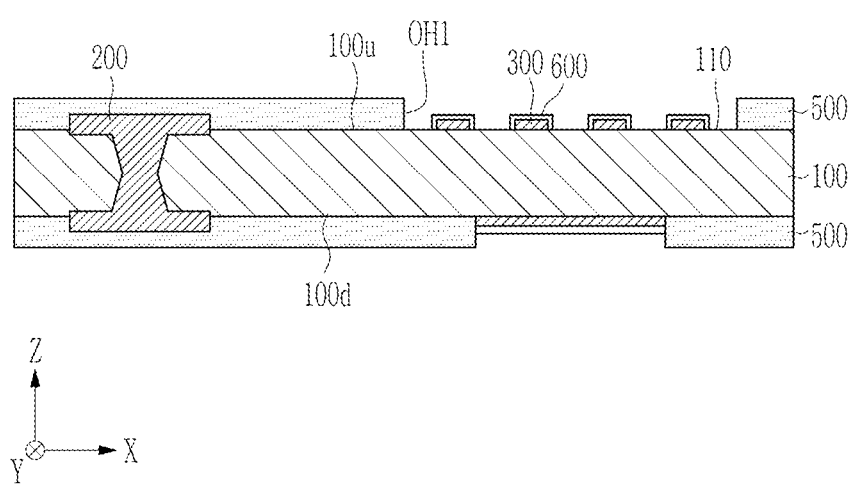
FIG. 2 is a cross-sectional view taken along a line II-II' of FIG. 1.
Figure 3:
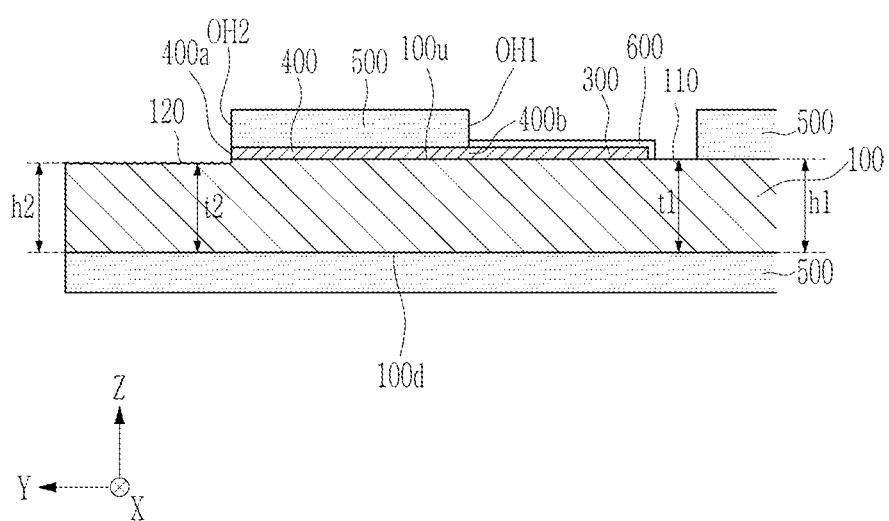
FIG. 3 is a cross-sectional view taken along a line III-III' of FIG. 1.

FIG. 1 is a plane view of a circuit board according to an embodiment, FIG. 2 is a cross-sectional view taken along a line II-II' of FIG. 1, and FIG. 3 is a cross-sectional view taken along a line III-III' of FIG. 1.

As illustrated in FIGS. 1 to 3, the circuit board according to the embodiment includes an insulating layer 100, circuit wiring 200, a conductive pad 300, a plating lead-in wire (or a plating lead-in line) 400, a solder resist layer 500, and an auxiliary pad 600.

The insulating layer 100 may include a thermosetting resin such as epoxy resin, polyimide, or the like, a thermoplastic resin such as polyethylene (PE), polycarbonate (PC), polyvinyl chloride (PVC), or the like, a composite resin such as a prepreg impregnating a reinforcing material such as a glass fiber or an inorganic filler in the thermosetting resin and the thermoplastic resin and the like, or the like. In the present embodiment, the insulating layer 100 is a kind of a thermosetting resin, and includes a BT resin including a bismaleimide type and a triazine resin, but the present disclosure is not limited thereto, and the insulating layer 100 may be formed of various materials.

The insulating layer 100 may include a first surface 100d and a second surface 100u that face each other. In the present embodiment, the first surface may be a lower surface 100d and the second surface may be an upper surface 100u based on a Z-axis direction.

The circuit wiring 200 may be disposed on the insulating layer 100, and may transmit an electrical signal. In the present embodiment, a via hole is shown as an example of the circuit wiring 200, but the present disclosure is not necessarily limited thereto, and the circuit wiring of various structures is possible.

The conductive pad 300 may be disposed on the insulating layer 100, and may be connected to external wiring (not shown). An electrical signal of the circuit board may be exchanged with an external electronic component (not shown) using the conductive pads 300. The conductive pad 300 may overlap a first opening OH1. The conductive pad 300 may include a conductive material such as copper (Cu), gold (Au), silver (Ag), or the like. A width of the conductive pad 300 may be wider than that of the plating lead-in wire 400 for easy contact with the external wiring.

The plating lead-in wire 400 may be disposed on the insulating layer 100, and may transfer an electrical signal to the conductive pad 300 to plate the conductive pad 300.

The plating lead-in wire 400 may include a conductive material such as copper (Cu), gold (Au), silver (Ag), or the like.

The solder resist layer 500 may be disposed on the lower surface 100d and the upper surface 100u of the insulating layer 100, and may cover the circuit wiring 200 and the plating lead-in wire 400. The solder resist layer 500 may include an insulating material such as a solder resist or the like.

The solder resist layer 500 may have the first opening OH1 and a second opening OH2 spaced apart from each other. The first opening OH1 may be formed through a photolithography process, and the second opening OH2 may be formed through a laser processing process (or a photo etching process). The upper surface 100u of the insulating layer 100 may be exposed by the first opening OH1 and the second opening OH2.

The first opening OH1 may overlap the conductive pad 300 on a plane. In this case, the upper surface 100u of the insulating layer 100 may be exposed at a portion of the first opening OH1 that does not overlap the conductive pad 300.

One end 400a of the plating lead-in wire 400 may be disposed at the same line as one side wall of the second opening OH2 on a plane. The other end 400b of the plating lead-in wire 400 may be directly connected to the conductive pad 300, and may be integrally formed with the conductive pad 300.

Since the plating lead-in wire 400 is cut at the second opening OH2, the second opening OH2 does not overlap the plating lead-in wire 400 on a plane. Accordingly, the plating lead-in wire 400 may extend from the conductive pad 300 to the one side wall of the second opening OH2.

The solder resist layer 500 may be patterned using a laser processing process to provide the second opening OH2, and plating connection wiring 40 (see FIG. 11) below the second opening OH2 may be removed using the laser processing process. That is, in an etch-back process of separating the plating connection wiring 40 before an electrical test, a portion of the plating connection wiring 40 may be removed to be electrically separated using a laser processing process.

In the present embodiment, the portion of the plating connection wiring 40 may be removed using the laser processing process without using a separate dry film or a separate LPR ink that blocks the second opening OH2.

In this case, since a laser L (see FIG. 11) is capable of anisotropic etching, the solder resist layer 500 and the plating connection wiring 40 may be etched to the same width. That is, when the solder resist layer 500 and the plating connection wiring 40 are etched with an etchant for isotropic etching, the plating connection wiring 40 disposed below the solder resist layer 500 may be over-etched. Accordingly, a width at which the plating connection wiring 40 is etched may be greater than a width at which the solder resist layer 500 is etched. However, since the solder resist layer 500 and the plating connection wiring 40 are etched using the laser L in the present embodiment, the width at which the solder resist layer 500 is etched and the width at which the plating connection wiring 40 is etched may be the same. Accordingly, the one end 400a of the plating lead-in wire 400 may be disposed at the same line as the one side wall of the second opening OH2 on a plane. Here, the one side wall of the second opening OH2 may be a portion adjacent to the plating lead-in wire 400.

As described above, since the solder resist layer 500 and the plating connection wiring 40 are etched using the laser L in the present embodiment, over-etching of the plating connection wiring 40 by the etchant may be prevented.

In this case, since a second portion 120 of the insulating layer 100 overlapping the second opening OH2 is exposed by removing a portion of the solder resist layer 500 and a portion of the plating connection wiring 40 by laser processing, the upper surface 100u of the second portion 120 of the insulating layer 100 may be partially removed by the laser processing.

Accordingly, a thickness t2 of the second portion 120 of the insulating layer 100 overlapping the second opening OH2 may be thinner than a thickness t1 of a first portion 110 of the insulating layer 100 overlapping the first opening OH1. In addition, a height h2 of the upper surface 100u of the first portion 120 of the insulating layer 100 based on the lower surface 100d of the insulating layer 100 may be lower than a height h1 of the upper surface 100u of the first portion 110 of the insulating layer 100 based on the lower surface 100d of the insulating layer 100.

In one embodiment, after the second portion 120 of the insulating layer 100 being exposed by the laser processing, the insulating layer 100 may have a step portion at the one side wall of the second opening OH2. Accordingly, a vertical wall of the step portion, the one end 400a of the plating lead-in wire 400, and one end of the solder resist layer 500 covering the plating lead-in wire 400 may be coplanar with the one side wall of the second opening OH2.

In one embodiment, the plating lead-in wire may include the one end 400a connected to the one side wall of the second opening OH2 and the other end 400b connected to one side wall of the first opening OH1 facing the one side wall of the second opening OH2.

In one embodiment, the conductive pad 300 may include a reduced-width portion having a width reduced from an adjacent portion of the conductive pad 300 in an X-axis direction, and the reduced-width portion may be disposed in the first opening OH1 and include one end connected to the other end 400b of the plating lead-in wire 400 at the one side wall of the first opening OH1.

In addition, the upper surface 100u of the second portion 120 of the insulating layer 100 may be damaged by the laser processing. Accordingly, a surface roughness of the second portion 120 of the insulating layer 100 may be greater than that of the first portion 110 of the insulating layer 100 exposed by removing the solder resist layer 500 by a photolithography process.

The auxiliary pad 600 may cover the conductive pad 300. The auxiliary pad 600 may include a plating layer. The plating layer may be formed by a plating process, and may include gold (Au), silver (Ag), nickel (Ni), palladium (Pd), or the like.

A manufacturing method of a circuit board according to an embodiment will be described in detail with reference to FIGS. 4 to 11 along with FIGS. 1 to 3.

Figure 4:
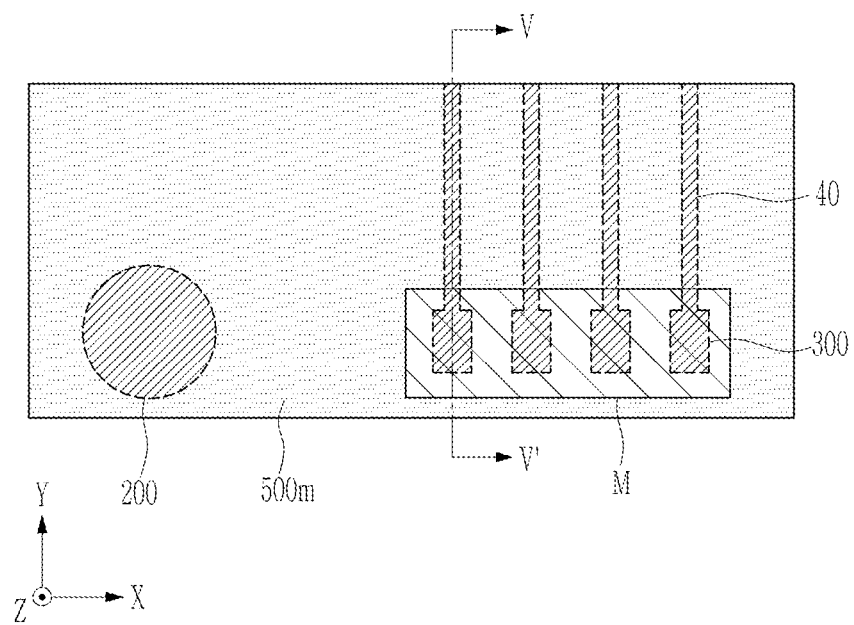
FIG. 4 is a plane view illustrating a step of a manufacturing method of a circuit board according to an embodiment.
Figure 5:
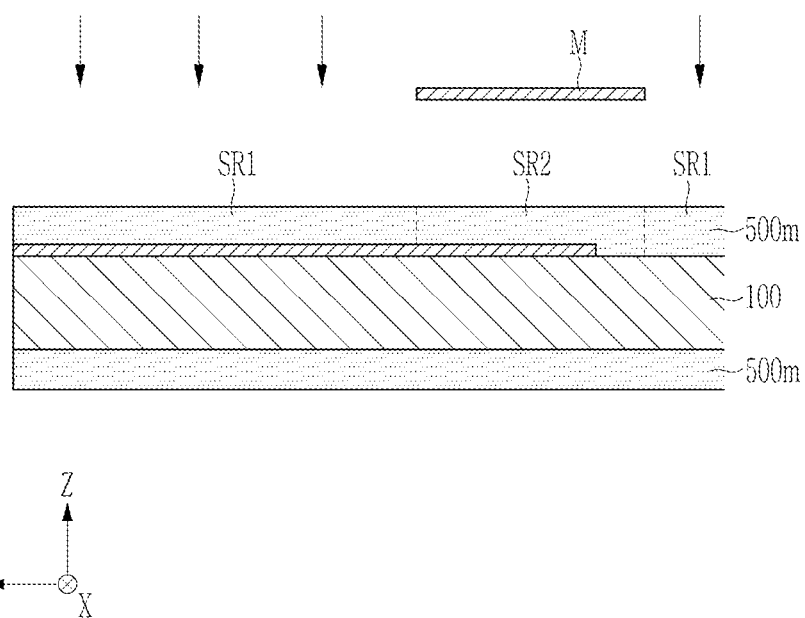
FIG. 5 is a cross-sectional view taken along a line V-V' of FIG. 4.
Figure 6:
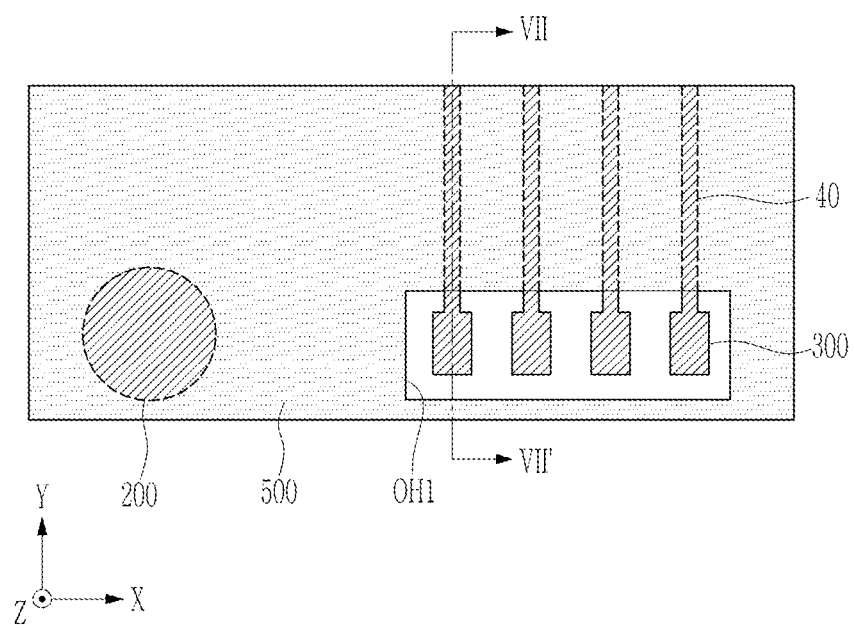
FIG. 6 is a plane view illustrating a next step of FIG. 4.
Figure 7:
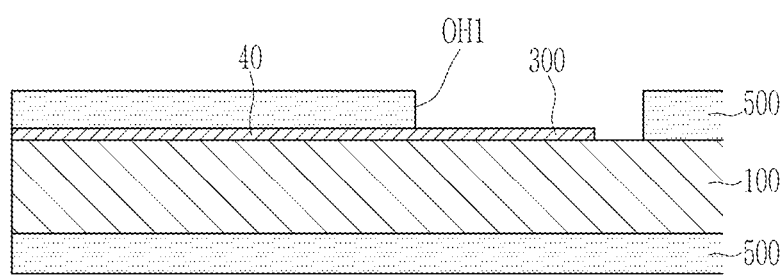
FIG. 7 is a cross-sectional view taken along a line VII-VII' of FIG. 6.
Figure 8:
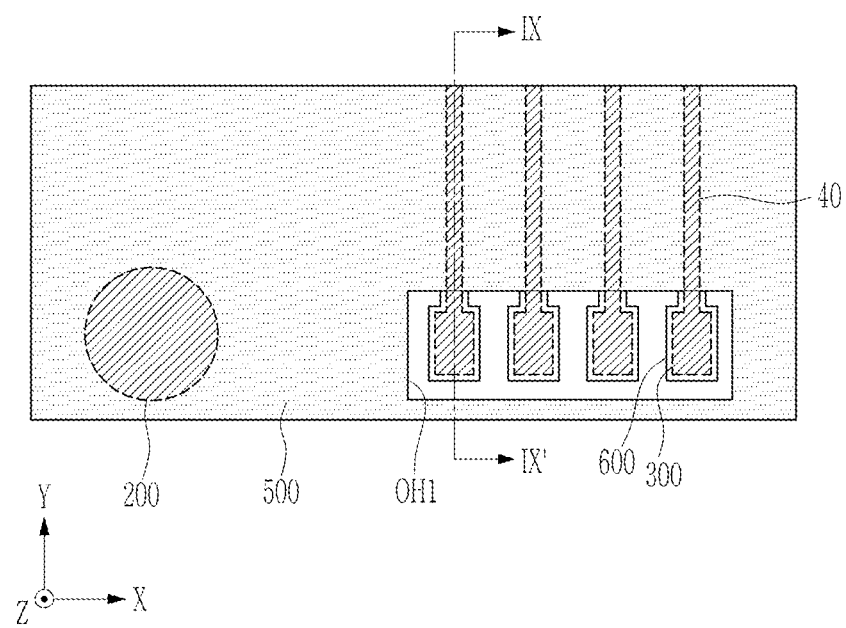
FIG. 8 is a plane view showing a next step of FIG. 6.
Figure 9:
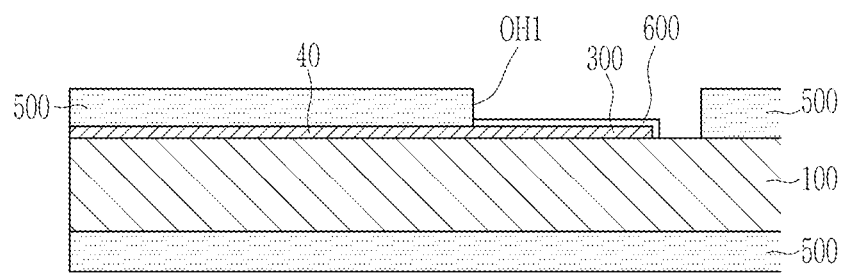
FIG. 9 is a cross-sectional view taken along a line IX-IX' of FIG. 8.
Figure 10:
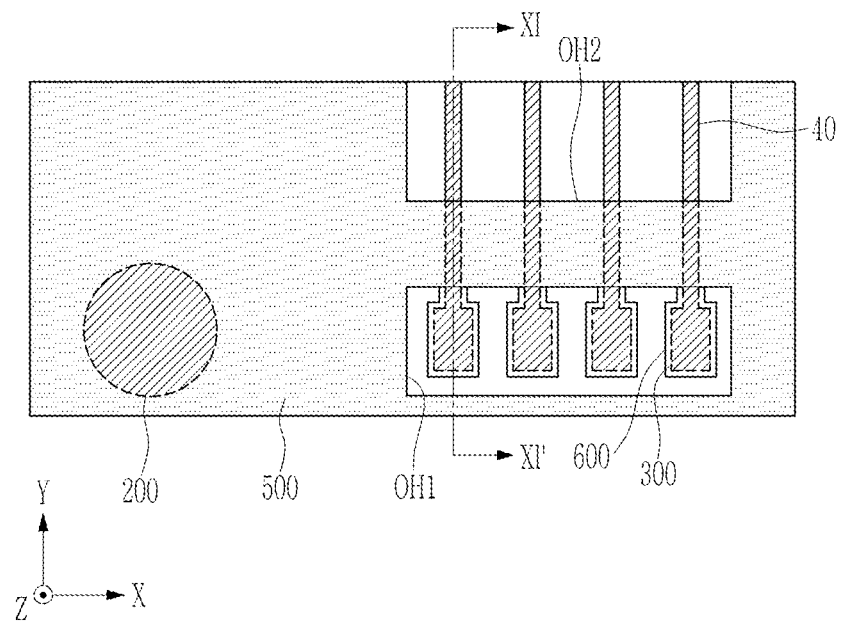
FIG. 10 is a plane view illustrating a next step of FIG. 8.
Figure 11:
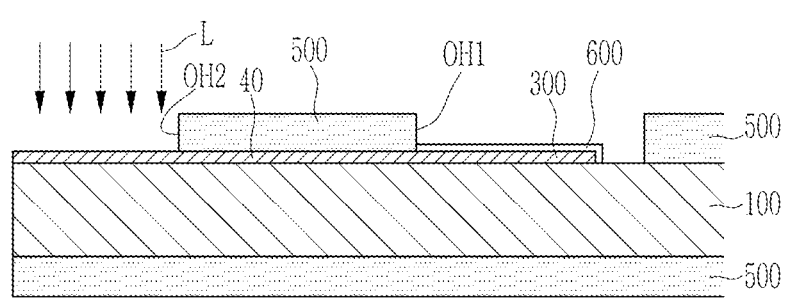
FIG. 11 is a cross-sectional view taken along a line XI-XI' of FIG. 10.

FIG. 4 is a plane view illustrating a step of the manufacturing method of the circuit board according to the embodiment, FIG. 5 is a cross-sectional view taken along a line V-V' of FIG. 4, FIG. 6 is a plane view illustrating a next step of FIG. 4, and FIG. 7 is a cross-sectional view taken along a line VII-VII' of FIG. 6. FIG. 8 is a plane view showing a next step of FIG. 6, FIG. 9 is a cross-sectional view taken along a line IX-IX' of FIG. 8, FIG. 10 is a plane view illustrating a next step of FIG. 8, and FIG. 11 is a cross-sectional view taken along a line XI-XI' of FIG. 10.

As shown in FIGS. 4 and 5, the circuit wiring 200, the plating connection wiring 40, and the conductive pad 300 are formed on the insulating layer 100. The circuit wiring 200, the plating connection wiring 40, and the conductive pad 300 may be formed by forming a conductive layer and then patterning the conductive layer through a photolithography process. In this case, the plating connection wiring 40 and the conductive pad 300 may be integrally formed.

Then, a resist layer 500m covering the circuit wiring 200, the plating connection wiring 40, and the conductive pad 300 is formed on the insulating layer 100. Then, a portion SR1 of the resist layer 500m is exposed and cured using a mask M. Then, an uncured remaining portion SR2 of the resist layer 500m is removed by development.

As shown in FIGS. 6 and 7, the uncured remaining portion of the resist layer 500m is removed to become the first opening OH1, and the solder resist layer 500 having the first opening OH1 is completed. The first opening OH1 of the solder resist layer 500 may overlap the conductive pad 300 on a plane. Here, since the resist layer 500m of the present disclosure is a positive photoresist film, an exposed portion of the resist layer 500m is cured, but it is possible to provide the first opening OH1 in a resist layer using a negative photoresist film in which an unexposed portion is cured.

In the present embodiment, a portion of the resist layer 500m is exposed and developed using the mask M to provide the first opening OH1, but the present disclosure is not limited thereto, and the first opening OH1 may be formed in the resist layer using various methods.

As shown in FIGS. 8 and 9, the auxiliary pad 600 covering the conductive pad 300 is formed. The auxiliary pad 600 may be formed using a plating process for applying an electrical signal to the plating connection wiring 40 and the conductive pad 300. In this case, the auxiliary pad 600 may be formed to overlap the first opening OH1. Since the plating connection wiring 40 is covered by the solder resist layer 500, the auxiliary pad 600 is not formed on the plating connection wiring 40.

As shown in FIGS. 10 and 11, a portion of the solder resist layer 500 overlapping the plating connection wiring 40 is removed using the laser processing process to provide the second opening OH2. Here, the laser L used in the laser processing process may include a YAG laser, a carbon dioxide ($CO_2$) laser, or the like. However, the present disclosure is not necessarily limited thereto, and various lasers may be applied to the laser L. The laser processing process may include laser drilling. The laser drilling is a processing method in which a laser beam is irradiated to a single point to melt and evaporate a target object with heat so that an opening is formed.

For example, power of the laser may be less than 1 W when the solder resist layer 500 including the solder resist is removed.

As shown in FIGS. 1 to 3, the laser processing process is continued to remove a portion of the plating connection wiring 40 overlapping the second opening OH2 so that the plating lead-in wire 400 is formed. That is, a portion of the plating connection wiring 40 directly connected to external wiring (not shown) may be removed so that the plating connection wiring 400 is formed as the plating lead-in wire 400 separated from the external wiring.

Here, power of the laser when a portion of the plating connection wiring 40 is removed may be greater than power of the laser when a portion of the solder resist layer 500 is removed. For example, power of the laser may be 3 W or more when a portion of the plating connection wiring 40 including copper is removed.

Since the second portion 120 of the insulating layer 100 overlapping the second opening OH2 is exposed by removing a portion of the solder resist layer 500 and a portion of the plating connection wiring 40 by the laser processing process, the upper surface 100u of the second portion 120 of the insulating layer 100 may be partially removed.

Accordingly, the thickness t2 of the second portion 120 of the insulating layer 100 overlapping the second opening OH2 may be thinner than the thickness t1 of the first portion 110 of the insulating layer 100 overlapping the first opening OH1. In addition, the height h2 of the upper surface 100u of the first portion 120 of the insulating layer 100 based on the lower surface 100d of the insulating layer 100 may be lower than the height h1 of the upper surface 100u of the first portion 110 of the insulating layer 100 based on the lower surface 100d of the insulating layer 100.

In addition, the upper surface 100u of the second portion 120 of the insulating layer 100 may be damaged by the laser processing. Accordingly, the surface roughness of the second portion 120 of the insulating layer 100 may be greater than that of the first portion 110 of the insulating layer 100 exposed by removing the solder resist layer 500 by the photolithography process.

In addition, as described above, since the laser L is capable of anisotropic etching, the solder resist layer 500 and the plating connection wiring 40 may be etched to the same width. Accordingly, the one end 400a of the plating lead-in wire 400 may be disposed at the same line as the one side wall of the second opening OH2 on a plane.

As described above, since the plating connection wiring 40 may be cut using the laser processing process to be electrically separated from the external wiring in the embodiment, the separate dry film or the separate LPR ink is not required to separate the plating connection wiring 40 in the etch-back process. Accordingly, a manufacturing process may be simplified to reduce manufacturing cost of the circuit board.

In addition, since there is no need to use the separate dry film or LPR ink in the etch-back process of separating the plating connection wiring 40, generation of a residue may be prevented so that a process issue such as the plating connection wiring 40 not being separated and the like is minimized.

On the one hand, in the above embodiment, the portion of the solder resist layer is removed using the laser and then the portion of the plating connection wiring is removed. However, another embodiment in which a portion of the solder resist layer and a portion of the plating connection wiring are simultaneously removed is also possible.

Hereinafter, a manufacturing method of a circuit board according to another embodiment will be described in detail with reference to FIG. 12.

Figure 12:
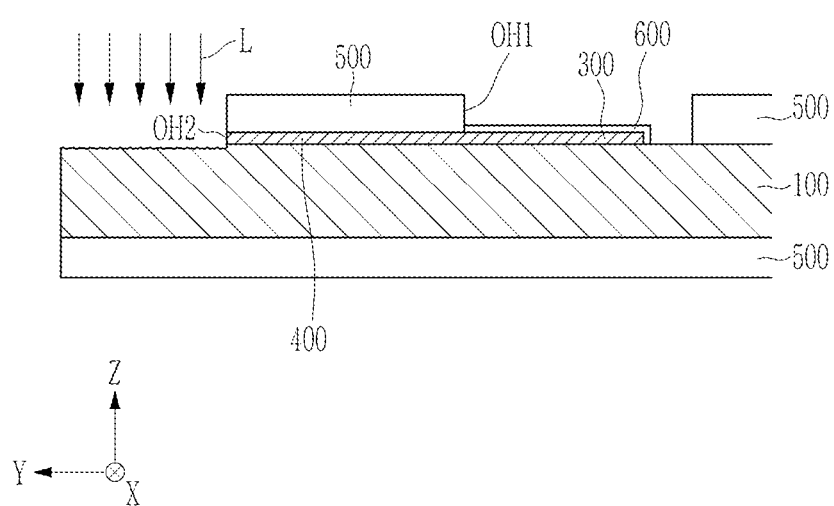
FIG. 12 is a cross-sectional view illustrating a step of a manufacturing method of a circuit board according to another embodiment.

FIG. 12 is a cross-sectional view illustrating a step of the manufacturing method of the circuit board according to the other embodiment.

The other embodiment shown in FIG. 12 is substantially the same as the embodiment shown in FIGS. 4 to 11 except that the solder resist layer and the plated connection wiring are simultaneously removed so that repeated description is omitted.

As shown in FIG. 12, in the manufacturing method of the circuit board according to the other embodiment, a portion of the solder resist layer 500 overlapping the plating connection wiring 40 is removed using a laser processing process to provide the second opening OH2, and at the same time, the plating connection wiring 40 exposed through the second opening OH2 is removed using the laser processing process. In this case, since the solder resist layer 500 and the plating connection wiring 40 have to be simultaneously removed using the laser L, power of the laser may be 3 W or more.

In this case, by removing the plating connection wiring 40 exposed through the second opening OH2, the plating connection wiring 40 is cut to provide the plating lead-in wire 400.

As described above, by simultaneously removing the solder resist layer 500 and the plating connection wiring 40 using the laser L, it is possible to shorten manufacturing time of the circuit board.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

<Description of symbols>

| | |
|---|---|
| 100: insulating layer | 200: circuit wiring |
| 300: conductive pad | 400: plating lead-in wire |
| 400a: one end of plating lead-in wire | |
| 400b: other end of plating lead-in wire | |
| 500: solder resist layer | 600: auxiliary pad |
| OH1: first opening | OH2: second opening |
| 40: plating connection wiring | |

What is claimed is:

1. A circuit board comprising:
   an insulating layer;
   a conductive pad disposed on the insulating layer;
   a plating lead-in wire that is disposed on the insulating layer and is connected to the conductive pad; and
   a solder resist layer that is disposed on the insulating layer and includes a first opening overlapping the conductive pad and a second opening spaced apart from the first opening,
   wherein the plating lead-in wire extends from the conductive pad to one side wall of the second opening, and a first portion of the insulating layer overlapping the first opening is thicker than a second portion of the insulating layer overlapping the second opening.

2. The circuit board of claim 1, wherein the plating lead-in wire does not overlap the second opening on a plane.

3. The circuit board of claim 1, wherein the insulating layer includes a first surface and a second surface facing each other, and a height of the first surface of the second portion of the insulating layer based on the second surface of the insulating layer is lower than a height of the first surface of the first portion of the insulating layer based on the second surface of the insulating layer.

4. The circuit board of claim 3, wherein a surface roughness of the second portion of the insulating layer is greater than a surface roughness of the first portion of the insulating layer.

5. The circuit board of claim 4, wherein one end of the plating lead-in wire is disposed at the same line as the one side wall of the second opening on a plane.

6. The circuit board of claim 1, further comprising an auxiliary pad covering the conductive pad,
   wherein the auxiliary pad overlaps the first opening.

7. The circuit board of claim 6, wherein the auxiliary pad includes a plating layer.

8. A circuit board comprising:
   an insulating layer;
   a conductive pad disposed on the insulating layer;
   a plating lead-in wire that is disposed on the insulating layer and is connected to the conductive pad; and
   a solder resist layer that is disposed on the insulating layer and includes a first opening overlapping the conductive pad and a second opening spaced apart from the first opening,
   wherein the plating lead-in wire extends from the conductive pad to one side wall of the second opening, and the insulating layer has a step portion at the one side wall of the second opening.

9. The circuit board of claim 8, wherein a thickness of a first portion of the insulating layer overlapping the first opening is greater than a thickness of a second portion of the insulating layer overlapping the second opening.

10. The circuit board of claim 8, wherein a vertical wall of the step portion, one end of the plating lead-in wire, and one end of the solder resist layer covering the plating lead-in wire are coplanar with the one side wall of the second opening.

11. The circuit board of claim 8, wherein the plating lead-in wire includes one end connected to the one side wall of the second opening and the other end connected to one side wall of the first opening facing the one side wall of the second opening,
   the conductive pad includes a reduced-width portion having a width reduced from an adjacent portion of the conductive pad, and
   the reduced-width portion is disposed in the first opening, and includes one end connected to the other end of the plating lead-in wire at the one side wall of the first opening.

* * * * *